United States Patent
Numata et al.

(10) Patent No.: US 7,696,833 B2
(45) Date of Patent: Apr. 13, 2010

(54) OSCILLATOR

(75) Inventors: Toshimasa Numata, Yokohama (JP);
Alejandro Puel, San Jose, CA (US);
Patricio Dauguet, San Jose, CA (US);
Xinghui Cai, San Jose, CA (US)

(73) Assignee: Fujitsu Media Devices Limited, Yokohama (JP)

( * ) Notice: Subject to any disclaimer, the term of this patent is extended or adjusted under 35 U.S.C. 154(b) by 193 days.

(21) Appl. No.: 11/699,025

(22) Filed: Jan. 29, 2007

(65) Prior Publication Data
US 2008/0180184 A1 Jul. 31, 2008

(51) Int. Cl.
H03B 5/18 (2006.01)
H03B 9/14 (2006.01)

(52) U.S. Cl. .................. 331/107 SL; 331/2; 331/36 L; 331/167

(58) Field of Classification Search ............... 331/36 L, 331/107 SL, 167, 2
See application file for complete search history.

(56) References Cited

U.S. PATENT DOCUMENTS 6,501,341 B2 * 12/2002 Mashimo .................. 331/96
6,552,620 B2 * 4/2003 Gitsevich et al. .............. 331/99

FOREIGN PATENT DOCUMENTS

| JP | 2003-258549 | 9/2003 |
|---|---|---|
| JP | 2004-235906 | 8/2004 |
| JP | 2005-160076 A | 6/2005 |
| JP | 2005-160077 A | 6/2005 |
| JP | 3764688 | 4/2006 |

* cited by examiner

Primary Examiner—Robert Pascal
Assistant Examiner—James E Goodley
(74) Attorney, Agent, or Firm—Arent Fox LLP (57) ABSTRACT

An oscillator includes a first oscillating portion that outputs a first oscillation signal having a first oscillation frequency through a first intermediate node to an output terminal, a mounting portion that includes an insulating layer and that mounts the first oscillating portion, a first line provided in the insulating layer and coupled between the first intermediate node and ground, a second line provided in the insulating layer and coupled between the first intermediate node and a power supply terminal, and a third line provided in the insulating layer and coupled between the first intermediate node and the output terminal.

11 Claims, 9 Drawing Sheets

OSCILLATOR

BACKGROUND OF THE INVENTION

1. Field of the Invention

This invention generally relates to oscillators, and more particularly, to an oscillator mounted on a mounting portion in which an oscillating portion has an insulating layer.

2. Description of the Related Art

Oscillators, in particular, voltage-controlled oscillators are for use in mobile communication terminals such as, for example, mobile telephones, Personal Handyphone Systems (PHS), wireless Local Area Networks (LAN), transceivers, and the like.

Figure 1:
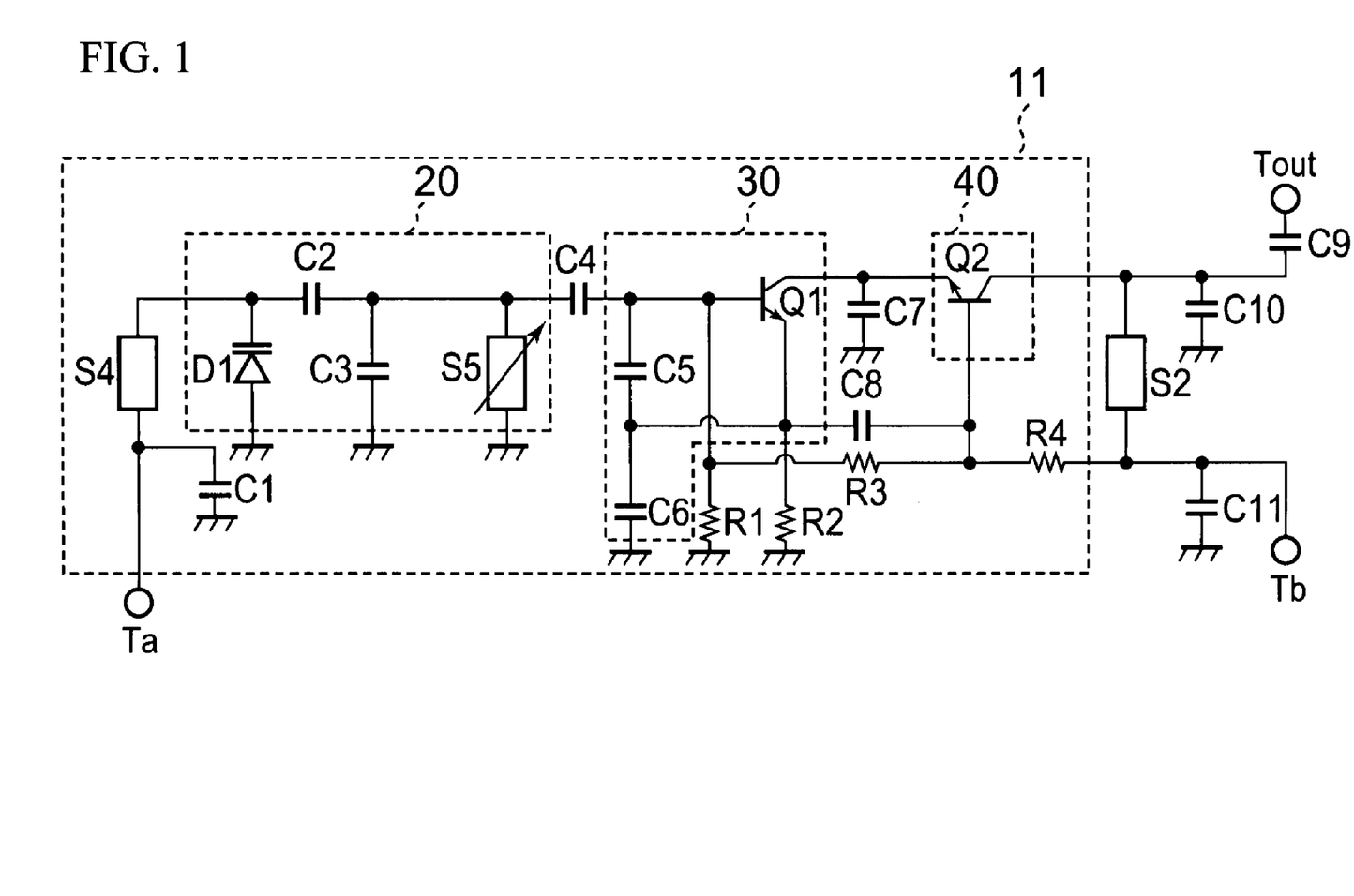
FIG. 1 is a circuit diagram showing a conventional oscillator.

FIG. 1 is a circuit diagram showing a conventional oscillator. The oscillator includes an oscillating portion 11, and the oscillating portion 11 includes: a resonance circuit 20; an oscillating circuit 30; and a buffer circuit 40. A transistor Q1 included in the oscillating circuit 30 and a transistor Q2 included in the buffer circuit 40 are connected in a cascade connection.

The resonance circuit 20 is composed of: a variable-capacitance diode D1; capacitors C2 and C3; and a line S5 such as a stripline or the like. A control voltage Va to be applied to a control terminal Ta, after high-frequency component thereof is removed by a line S4 and a capacitor C1, is applied to the variable-capacitance diode D1. The capacitance of the variable-capacitance diode D1 is varied by the control voltage Va and the resonance frequency of the resonance circuit 20 is changed.

The oscillating circuit 30 is composed of a bipolar transistor Q1 and capacitors C5 and C6, and serves as a clap oscillating circuit, which is one type of Colpitts oscillating circuit. The base of the transistor Q1 is coupled through a coupling capacitor C4 to the resonance circuit 20.

The buffer circuit 40 includes a bipolar transistor Q2. The emitter of the bipolar transistor Q2 is connected to the collector of the transistor Q1 in the oscillating circuit 30, and the base of the transistor Q2 is coupled through a coupling capacitor C8 to the emitter of the transistor Q1.

A line S2 serves as an inductor for choke to remove alternating component, when the power is supplied from a power supply Vb to the collector of the transistor Q2. Resistors R1 through R4 determine how the transistors Q1 and Q2 are biased. Capacitors C7, C10, and C11 short-circuit the high-frequency component to ground.

Like the conventional oscillator of FIG. 1, the oscillator having the buffer circuit 40 therein includes the transistor Q2 and the like, thereby increasing the mounting area with a number of parts. The costs will also be increased. The oscillator that does not include the buffer circuit 40, however, has drawbacks in that the oscillation is not stable and the load change, higher harmonic level, and carrier to noise (C/N) ratio are not excellent.

SUMMARY OF THE INVENTION

The present invention has been made in view of the above circumstances and provides a small-sized and low-cost oscillator, by which load change, higher harmonic level, and carrier to noise (C/N) ratio can be improved.

According to one aspect of the present invention, there is provided an oscillator including: a first oscillating portion that outputs a first oscillation signal having a first oscillation frequency through a first intermediate node to an output terminal; a mounting portion that includes an insulating layer and that mounts the first oscillating portion; a first line provided in the insulating layer and coupled between the first intermediate node and ground; a second line provided in the insulating layer and coupled between the first intermediate node and a power supply terminal; and a third line provided in the insulating layer and coupled between the first intermediate node and the output terminal. It is therefore possible to fine adjust the inductance by use of the first line through third line in the design process of the oscillator. This makes it possible to design the oscillator in which load change and higher harmonic level can be improved. The Q of the high-frequency characteristics is high in the first line and the second line, thereby making available a stable oscillator in high frequencies. Furthermore, the number of parts can be reduced in the oscillator, thereby leading to the reduction of size and cost thereof.

According to another aspect of the present invention, there is provided an oscillator including: a first oscillating portion that outputs a first oscillation signal having a first oscillation frequency through a first inductance element to an output terminal, and that receives a voltage supplied from a first intermediate node; and a second oscillating portion that outputs a second oscillation signal having a second oscillation frequency through a second inductance element to the output terminal, and that receives the voltage supplied through the first inductance element and the second inductance element. The inductance element for choke can be commonly provided to the first oscillating portion and the second oscillating portion, thereby making available the oscillator in which the number of parts can be reduced and the size and cost can be reduced.

BRIEF DESCRIPTION OF THE DRAWINGS

Exemplary embodiments of the present invention will be described in detail with reference to the following drawings, wherein.

DESCRIPTION OF THE PREFERRED EMBODIMENTS

A description will now be given, with reference to the accompanying drawings, of exemplary embodiments of the present invention.

First Exemplary Embodiment

Figure 2:
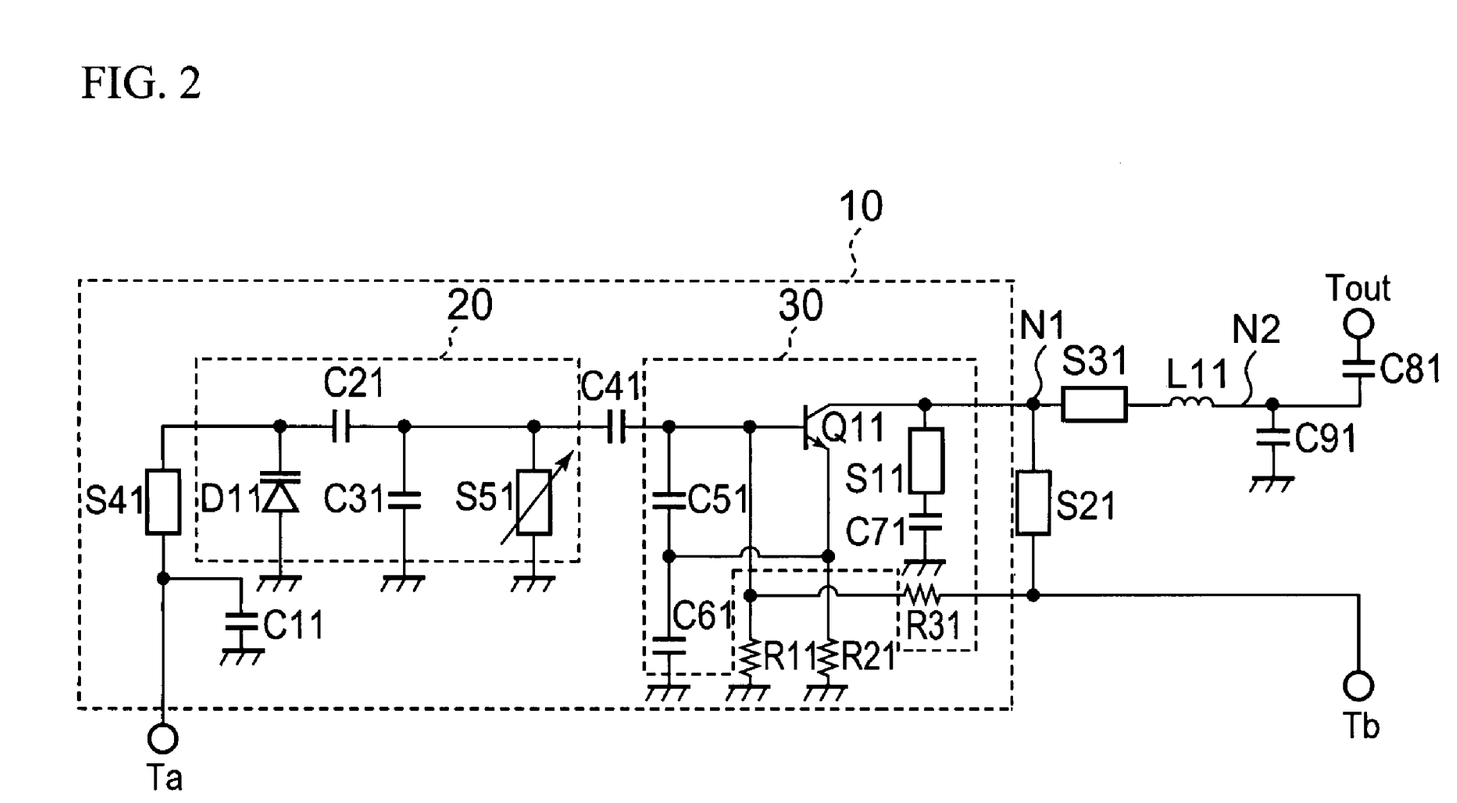
FIG. 2 is a circuit diagram in accordance with a first exemplary embodiment of the present invention.

FIG. 2 is a circuit diagram in accordance with a first exemplary embodiment of the present invention. An oscillating portion 10 included in the oscillator employed in the first exemplary embodiment includes: the resonance circuit 20; and the oscillating circuit 30. The oscillator employed in the first exemplary embodiment does not include a buffer circuit, unlike the conventional oscillator of FIG. 1.

The resonance circuit 20 is composed of: a variable-capacitance diode D11; capacitors C21 and C31; and a line S51. The variable-capacitance diode D11 is connected between one end of a line S41 connected to a control terminal Ta and ground, and the cathode of the variable-capacitance diode D11 is connected by one end of the capacitor C21. The capacitor C31 and the line S51 are connected in parallel between the other end of the capacitor C21 and ground. When a control voltage Va applied to the control terminal Ta is varied, the capacitance of the variable-capacitance diode D11 is changed and the resonance frequency of the resonance circuit 20 is then changed. The control voltage Va, after the high-frequency component thereof is removed by the line S41 and the capacitor C11, is applied to the cathode of the variable-capacitance diode D11. As described heretofore, the resonance circuit 20 generates a resonance signal having the frequency controlled to a first oscillating frequency by the control voltage Va.

The oscillating circuit 30 is composed of a bipolar transistor Q11 and capacitors C51 and C61, and serves as a clap oscillating circuit, which is one type of Colpitts oscillating circuit. The base of the transistor Q11 is coupled through a coupling capacitor C41 to the resonance circuit 20. The capacitors C51 and C61 are connected in series between the base of the transistor Q11 and ground. The node between the capacitors C51 and C61 is connected to the emitter of the transistor Q11. Thus, the oscillating circuit 30 generates a first oscillation signal having a first oscillating frequency, which is the frequency of the resonance signal generated by the resonance circuit 20.

The collector of the transistor Q11 in the oscillating circuit 30 is connected to a first intermediate node N1. A first line S11 and a capacitor C71 (first capacitor) are connected in series between the first intermediate node N1 and ground. The first line S11 and the capacitor C71 ground the high-frequency component and low-frequency component out of the oscillation signal output from the collector of the transistor Q11 in the oscillating circuit 30. This makes it possible to prevent the leakage of the first oscillation signal having the first oscillating frequency to ground, the first oscillation signal being output from the oscillating circuit 30.

A second line S21 is connected between the first intermediate node N1 and a power terminal Tb. The second line S21 serves as an inductor for choke of a power supply Vb, and a direct current component of the power supply Vb is applied to the collector of the transistor Q11. This makes it possible to prevent the leakage of the first oscillation signal having the first oscillating frequency to the power supply.

A third line S31, and inductor L11, and a capacitor C81 (second capacitor) are connected in series between the first intermediate node N1 and an output terminal Tout. A capacitor C91 is connected between a second intermediate node N2 and ground, the second intermediate node N2 being connected between the inductor L11 and the capacitor C81. A third line S31, the inductor L11, and the capacitor C81 remove the low-frequency component from the first oscillation signal. The capacitor C91 removes the high-frequency component from the first oscillation signal. Thus, the first oscillation signal having the first oscillating frequency is output from the output terminal Tout. In addition, it is possible to prevent an undesired frequency component from entering the oscillating circuit 30 from the output terminal Tout.

Resistors R11, R21, and R31 are provided for applying desired voltages respectively to the collector, base, and emitter of the transistor Q11.

Figure 3:
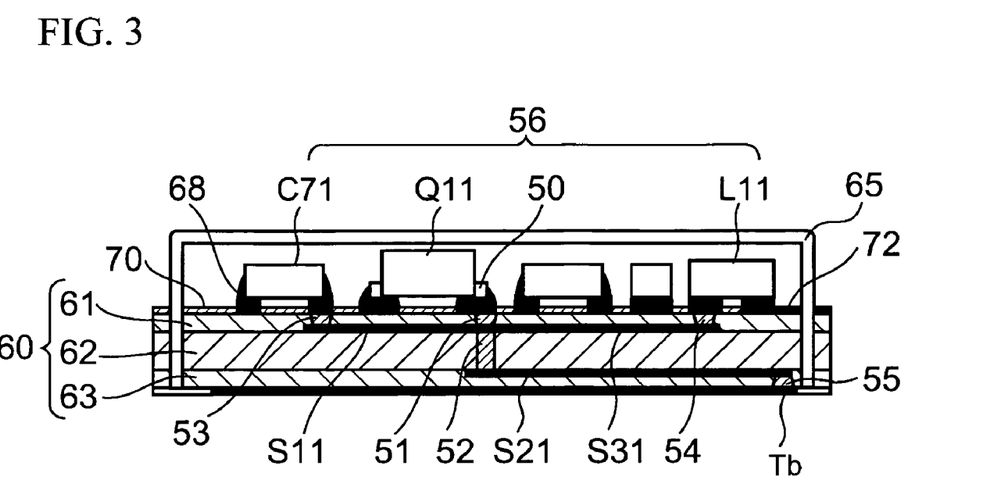
FIG. 3 is a schematic cross-sectional view of an oscillator in accordance with the first exemplary embodiment of the present invention.

FIG. 3 is a schematic cross-sectional view of the oscillator in accordance with the first exemplary embodiment of the present invention. The oscillator employed in the first exemplary embodiment includes: a stacked layer 60 composed of insulating layers 61 through 63 of, for example, such as ceramic or the like; chip parts 56; and a cover portion 65 that covers the stacked layer 60 and the chip parts 56. The cover portion 65 is inserted into through holes provided in the stacked layer 60, and is soldered. The chip parts 56 may include the capacitor C71; the transistor Q11; the inductor L11; and the like.

The chip parts 56 are mounted on a wiring substrate 70 by use of solders 68. An interconnection 72 made of a metal, for example, gold (Au), copper (Cu), or the like is formed in the wiring substrate 70. There are provided connecting portions 51 through 55 and lines S11, S21, and S31 in the insulating layers 61 through 63, the connecting portions 51 through 55 being vias extending through the insulating layers 61 through 63 and having a metal such as, for example, Au, Cu, or the like embedded therein, the lines S11, S21, and S31 being line patterns made of a metal such as, for example, Au, Cu, or the like.

One end of the first line S11 is coupled through the connecting portion 53 to the capacitor C71. The other end of the first line S11 is coupled through the connecting portion 51 to a collector 50 of the transistor Q11. One end of the second line S21 is coupled through the connecting portion 55 to a foot-pad, which is a power terminal Tb, formed in the insulating layer 63. The other end of the second line S21 is coupled through the connecting portions 51 and 52 to the collector 50 of the transistor Q11. One end of the third line S31 is coupled through the connecting portion 54 to one end of the inductor L11. The other end of the inductor L11 is coupled through a capacitor C81, not shown, and a connecting portion, not shown, to the output terminal Tout, not shown. The other end of the third line S31 is coupled through the connecting portion 51 to the collector 50 of the transistor Q11. The connecting portions 51 and 52 correspond to the first intermediate node N1 shown in FIG. 2.

As stated heretofore, the oscillator employed in the first exemplary embodiment includes the oscillating portion 10 that outputs the first oscillation signal having the first oscillating frequency through the first intermediate node N1 to the output terminal Tout. In addition, the oscillator employed in the first exemplary embodiment also includes the stacked layer 60 composed of the insulating layers 61 through 63, the stacked layer 60 being a mounting portion that mounts the oscillating portion 10. Furthermore, the first line S11 connected between the first intermediate node N1 and ground is provided in the insulating layer 61, the second line S21 connected between the first intermediate node N1 and the power terminal Tb is provided in the insulating layer 62, and the third line S31 connected between the first intermediate node N1 and the output terminal Tout is provided in the insulating layer 61.

The first line S11 and the second line S21 make it possible to prevent the leakage of the first oscillation signal output from the oscillating portion 10 to ground or to a power supply. This can suppress the degradation of C/N ratio. The third line S31 and the inductor L11 make it possible to prevent a signal having a higher frequency than the first oscillating frequency from entering the oscillating portion 10, the signal being input from the output terminal Tout.

A description will now be given of a factor of unstable oscillation, namely, unstable load change or harmonic level, in an oscillator that does not include a buffer circuit therein. In designing an oscillator that does not have a buffer circuit therein with a small load change and small harmonic level, the inductances corresponding to the lines S11, S21, and S31 are to be simulated. Nevertheless, the simulation result and the actual result are different in many cases. For this reason, the load change or the harmonic level is unstable in the oscillator that does not have a buffer circuit therein.

In accordance with the first exemplary embodiment of the present invention, the line S11, S21, and S31 are formed up of line patterns provided in the insulating layers 61 and 62. This makes it possible to fine adjust the inductance by use of the lines S11, S21, and S31 in the design process of the oscillator. It is therefore possible to design the oscillator in which the load change and the harmonic level are improved. In addition, since the Q of the high-frequency characteristics is high at the lines S11, S21, and S31, the oscillator stable in high frequencies is available. Furthermore, since a buffer circuit is not included, the number of parts can be reduced, thereby leading to the reduction in size and cost.

Figure 4:
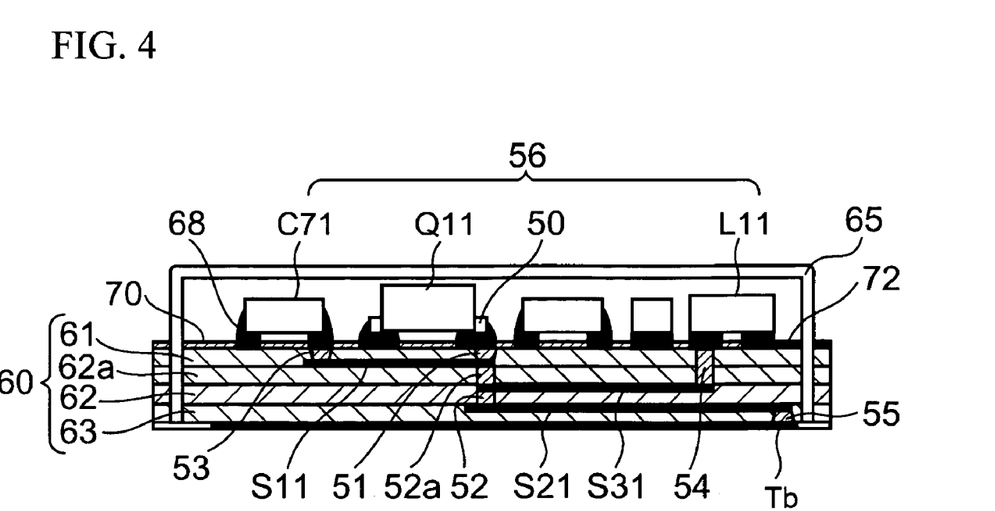
FIG. 4 is a schematic cross-sectional view in accordance with a modification 1 of the first exemplary embodiment of the present invention.

FIG. 4 is a schematic cross-sectional view in accordance with a modification 1 of the first exemplary embodiment of the present invention. Unlike the configuration of FIG. 3 used in the first exemplary embodiment, there is provided an insulating layer 62a interposed between the insulating layer 61 and the insulating layer 62, and the third line S31 is provided in the insulating layer 62a. Other configurations are same as those of the first exemplary embodiment and a detailed description will be omitted.

Preferably, the lines S11, S21, and S31 are respectively provided in different insulating layers in accordance with the modification 1 of the first exemplary embodiment. This causes the coupling between the line S11, S21, and S31 to be smaller. This also reduces the difference between the simulation result and the actual result. It is therefore possible to facilitate the fine adjustment by use of the lines S11, S21, and S31 and to provide an oscillator in which the load change and the higher harmonic level are further improved.

Also, in order to reduce the number of the insulating layers, the lines S11, S21, and S31 may be provided in an identical insulating layer.

Figure 5:
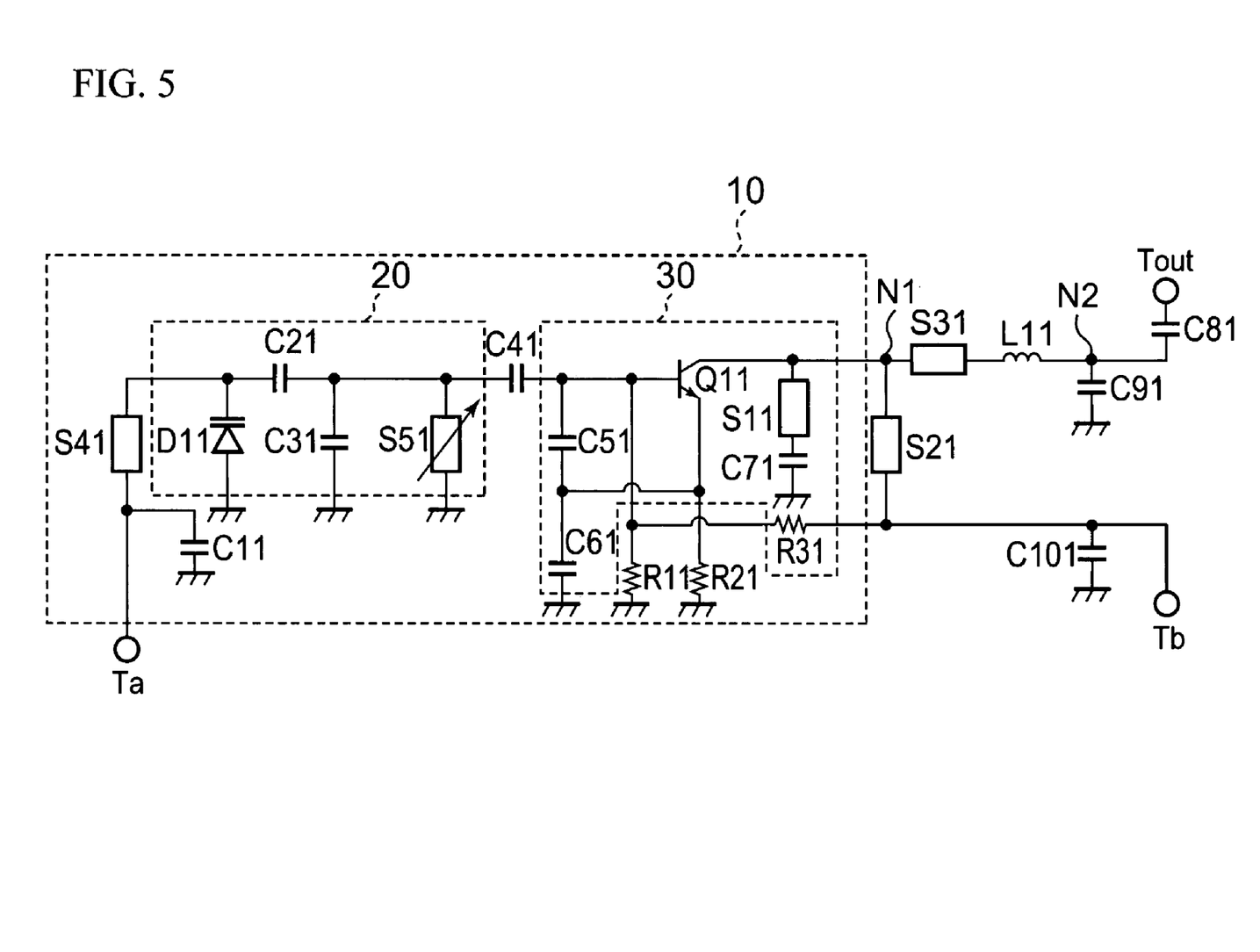
FIG. 5 is a circuit diagram of an oscillator in accordance with a modification 2 of the first exemplary embodiment of the present invention.

FIG. 5 is a circuit diagram of an oscillator in accordance with a modification 2 of the first exemplary embodiment of the present invention. Unlike the configuration of FIG. 2 used in the first exemplary embodiment, there is provided a capacitor C101 to remove high frequency between the power terminal Tb and ground. Other configurations are same as those of the first exemplary embodiment and a detailed description will be omitted.

Second Exemplary Embodiment

Figure 6:
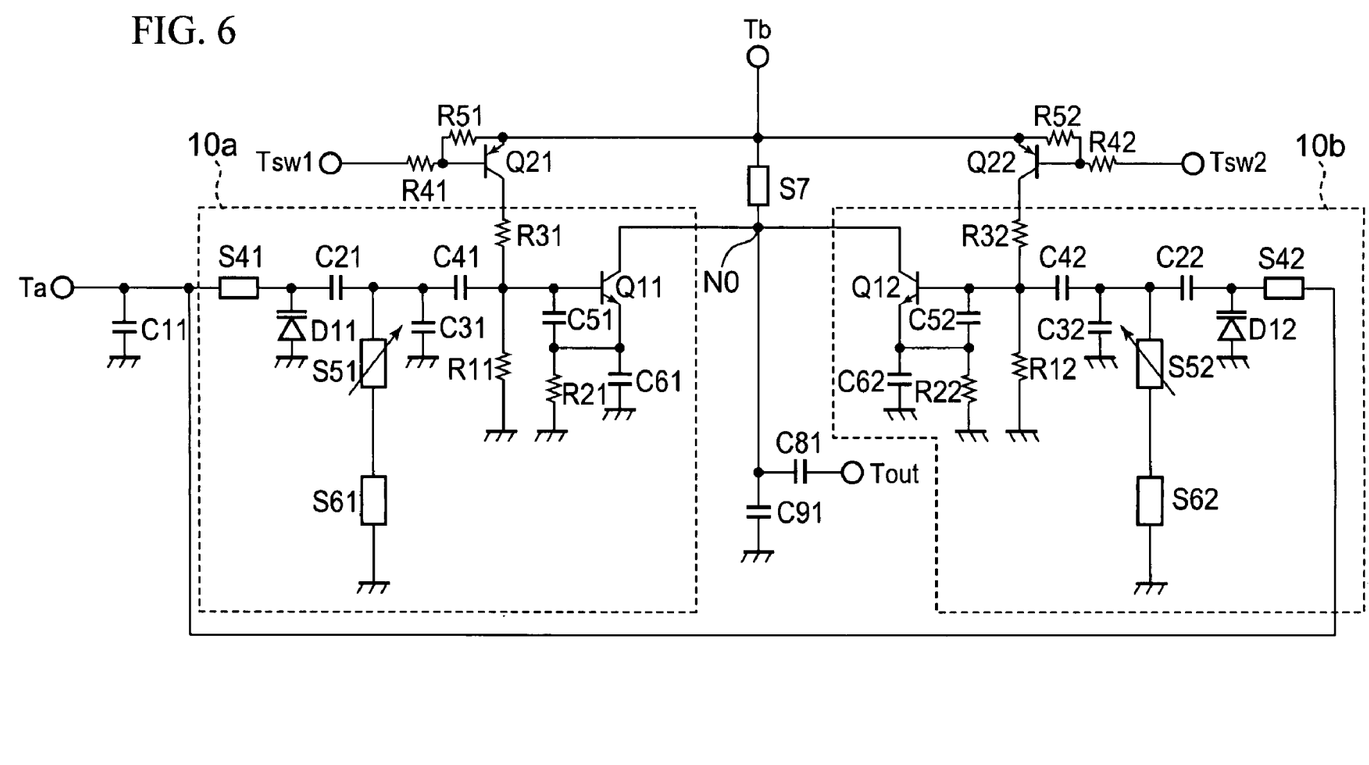
FIG. 6 is a circuit diagram of an oscillator of a comparative example.

FIG. 6 is a circuit diagram of an oscillator of a comparative example. The oscillator of the comparative example is a two-band oscillator, and includes: a first oscillating portion 10a that outputs the first oscillation signal; and a second oscillating portion 10b that outputs the second oscillation signal, which is different from the first oscillation signal. The configurations of the first oscillating portion 10a and the second oscillating portion 10b have the same configurations as those of the oscillating portion 10 used in the first exemplary embodiment, except that a line S61 is connected between a line S51 and ground and the capacitor C11 is commonly connected to the first oscillating portion 10a and the second oscillating portion 10b, and a detailed explanation will be omitted here.

The base of the transistor Q11 in the first oscillating portion 10a and that of the transistor Q12 in the second oscillating portion 10b are respectively coupled through the resistors R31 and R32 to the collector of the transistor Q21 and that of the transistor Q22. The emitter of the transistor Q21 and that of the transistor Q22 are connected to the power terminal Tb, and are also coupled through resistors R51 and R52 respectively to the base thereof. The base of the transistor Q21 and that of the transistor Q22 are respectively coupled through resistors R41 and R42 to switch terminals Tsw1 and Tsw2. According to switching signals Vsw1 ad Vsw2 respectively supplied to the switch terminals Tsw1 and Tsw2, the power Vb is respectively supplied to the first oscillating portion 10a and the second oscillating portion 10b.

The collector of the transistor Q11 in the first oscillating portion 10a and that of the transistor Q12 in the second oscillating portion 10b are connected to a common node N0. A line S7 is connected between the node N0 and the power terminal Tb, the capacitor C81 is connected between the node N0 and the output terminal Tout, and the capacitor C91 is connected between the node N0 and ground.

In the comparative example, the oscillation signals generated by the oscillating portions 10a and 10b are respectively selected by the switching signals Vsw1 and Vsw2, and are output from the output terminal Tout.

Figure 7:
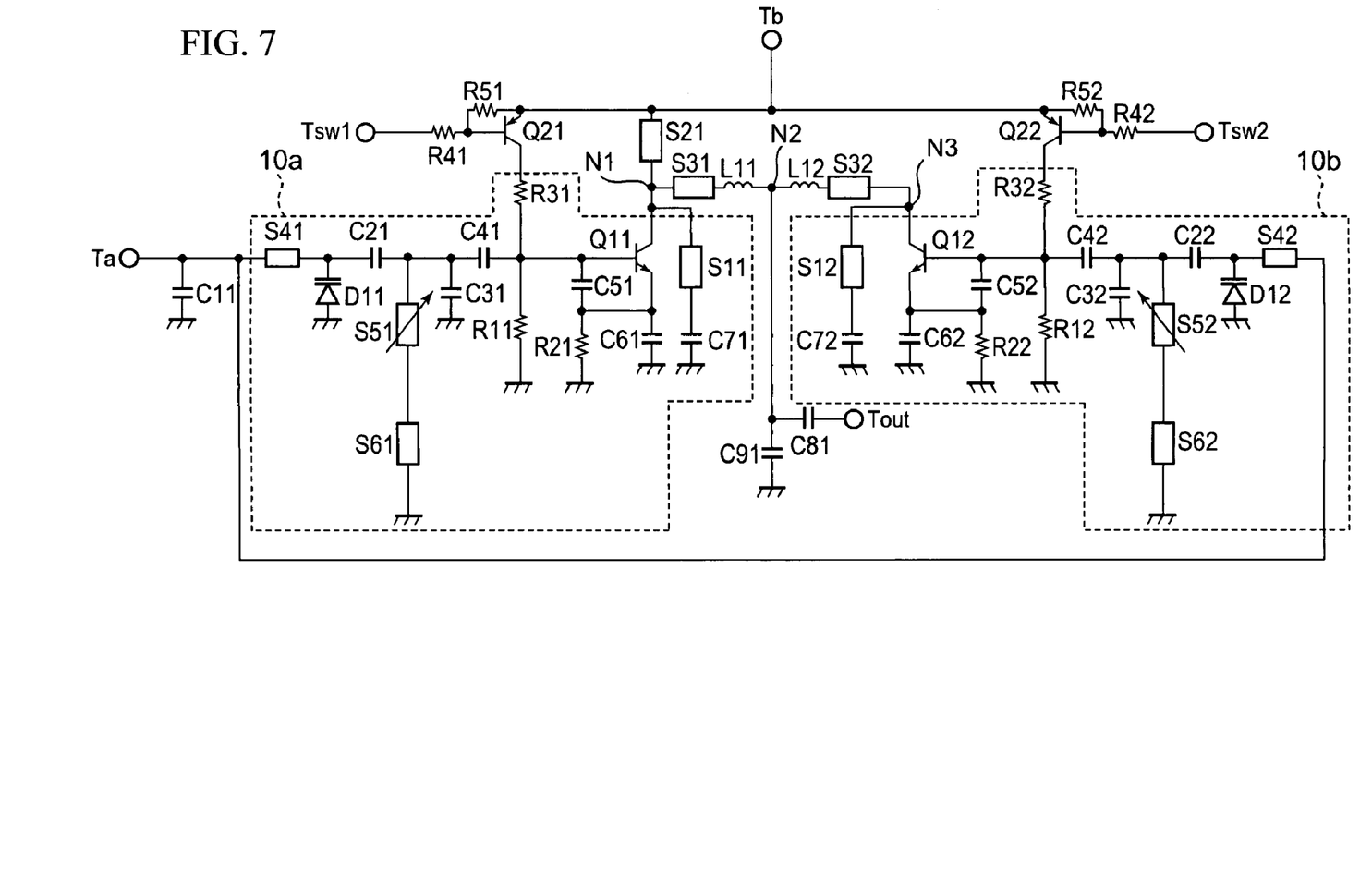
FIG. 7 is a circuit diagram of the oscillator in accordance with a second exemplary embodiment of the present invention.

FIG. 7 is a circuit diagram of the oscillator in accordance with a second exemplary embodiment of the present invention. In a similar manner to the oscillator of the comparative example, the oscillator employed in the second exemplary embodiment includes: the first oscillating portion 10a; and the second oscillating portion 10b. Also, in a similar manner to the oscillator of the comparative example, the transistors Q21 and Q22 are respectively coupled between the base of the transistor Q11 in the first oscillating portion 10a and the power terminal Tb, and between that of the transistor Q12 in the second oscillating portion 10b and the power terminal Tb. The first intermediate node N1 connected by the collector of the transistor Q11 in the first oscillating portion 10a is also connected by the lines S11, S21, and S31, in the same manner as the first exemplary embodiment. The collector of the transistor Q12 in the second oscillating portion 10b is connected to a third intermediate node N3. The third intermediate node N3 is coupled through an inductor L12 and a line S32 to the second intermediate node N2. A line S12 and a capacitor C72 are connected in series between the third intermediate node N3 and ground.

The switching transistors Q21 and Q22 have the same configurations as those of the comparative example shown in FIG. 6. If the power terminal Vb of the power supply Tb is set to 2.8 V and the switching signals Vsw1 ad Vsw2 are both 2.8 V (high level), the transistors Q21 and Q22 are off. This does not supply the power supply voltage to the base of the transistor Q11 and that of the Q12 respectively included in the first oscillating portion 10a and the second oscillating portion 10b. Accordingly, the oscillator is in stand-by mode, namely, oscillation halt state.

If the switching signal Vsw1 is 0 V (low level) and the switching signal Vsw2 is 2.8 V (high level), the transistor Q21 is on and the transistor Q22 is off. Accordingly, the power supply voltage is supplied to the first oscillating portion 10a and the first oscillation signal of the first oscillating portion 10a is output from the output terminal Tout.

If the switching signal Vsw1 is 2.8 V (high level) and the switching signal Vsw2 is 0 V (low level), the second oscillation signal of the second oscillating portion 10b is output from the output terminal Tout. In this manner, it is possible to select from which oscillating portion the oscillation signal is to be output by use of the switching signals Vsw1 and Vsw2.

In the second exemplary embodiment, in addition to the first oscillating portion 10a, there is provided the second oscillating portion 10b, in which the second oscillation signal having the second oscillating frequency is output through the second intermediate node N2 to the output terminal Tout. The second oscillating portion 10b is coupled through the inductor L12 and the line S32, which serve as a second inductance element, to the second intermediate node N2. That is, in the first oscillating portion 10a, the first oscillation signal is output through a first inductance element, which includes the line S31 and the inductor L11, to the output terminal Tout, and a voltage is supplied from the first intermediate node N1. Meanwhile, in the second oscillating portion 10b, the second oscillation signal is output through the second inductance element, which includes the line S32 and the inductor L12, to the output terminal Tout, and a voltage is supplied through the first inductance element and the second inductance element.

As stated, the second line S21 is connected between the first oscillating portion 10a and the power terminal Tb, as an inductance element for choke, whereas not only the second line S21 but also the first inductance element and the second inductance element are connected between the second oscillating portion 10b and the power terminal Tb. This allows the magnitude of the inductance for choke between the second oscillating portion 10b and the power terminal Tb to be greater than that between the first oscillating portion 10a and the power terminal Tb.

A large inductance for choke is needed for the oscillating portion having a low oscillation frequency. When the second oscillation frequency of the second oscillating portion 10b is lower than the first oscillation frequency of the first oscillating portion 10a, it is desirable that the inductance for choke connected to the second oscillating portion 10b be greater than that connected to the first oscillating portion 10a. In the second exemplary embodiment, the second line S21 is used as a common inductance for choke so that the first oscillating portion 10a and the second oscillating portion 10b are connected to the power terminal Tb, thereby reducing the number of parts and reducing the size of the oscillator.

In addition, the second inductance element partially serves as the inductance for choke between the second oscillating portion 10b and the power terminal Tb, and also serves as an inductance for removal of high frequency between the second oscillating portion 10b and the output terminal Tout. This reduces the number of parts and reduces the size of the oscillator.

Figure 8:
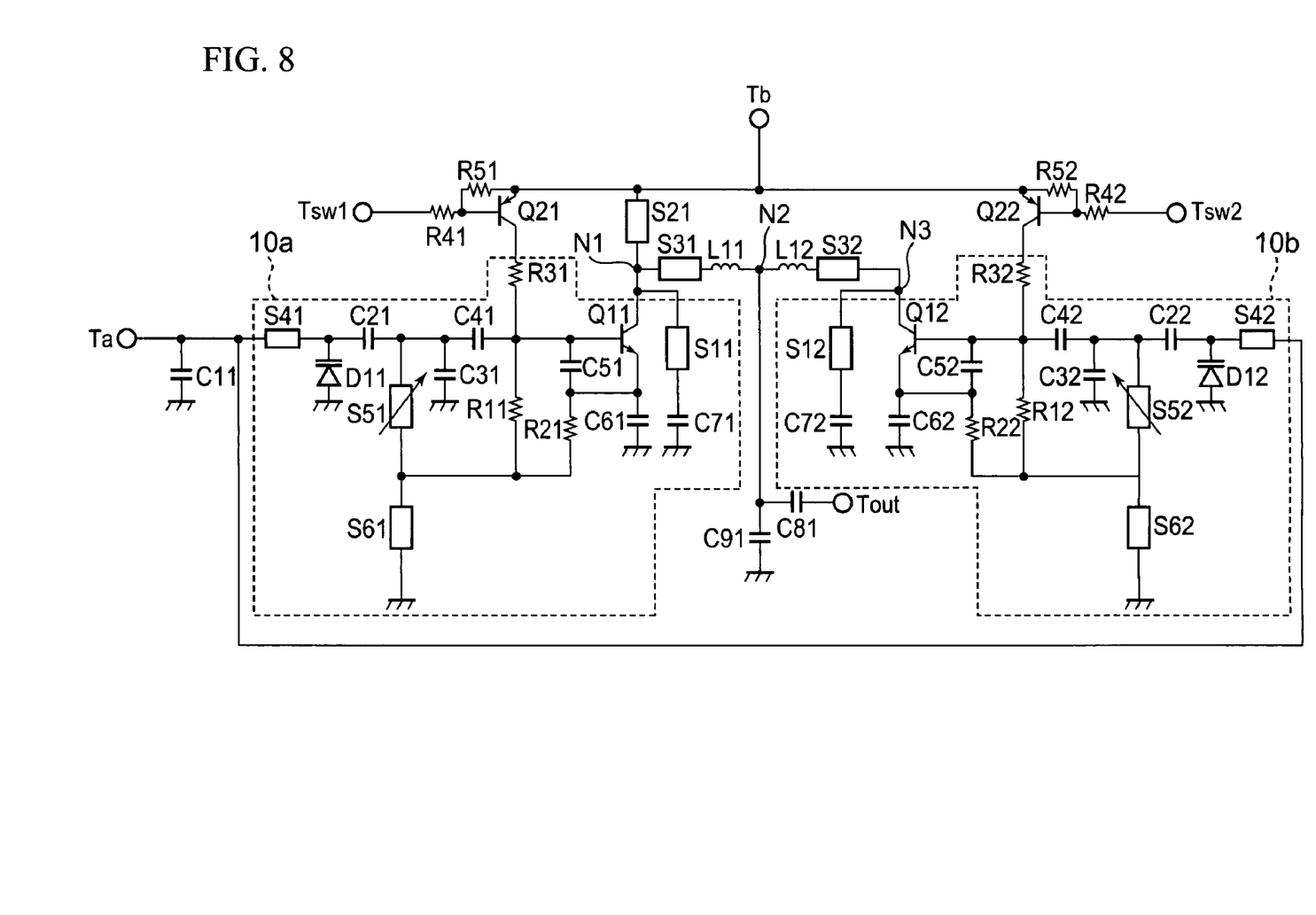
FIG. 8 is a circuit diagram of the oscillator employed in a modification 1 of the second exemplary embodiment of the present invention.

FIG. 8 is a circuit diagram of the oscillator employed in a modification 1 of the second exemplary embodiment of the present invention. The resistors R11 and R12 are connected through a line S61 to ground in the first oscillating portion 10a, unlike the configuration shown in FIG. 7 used in the second exemplary embodiment. The configuration of the second oscillating portion 10b is similar to that of the first oscillating portion 10a. In the oscillator employed in the modification 1 of the second exemplary embodiment, other configurations of are same as those of the first exemplary embodiment.

Figure 9:
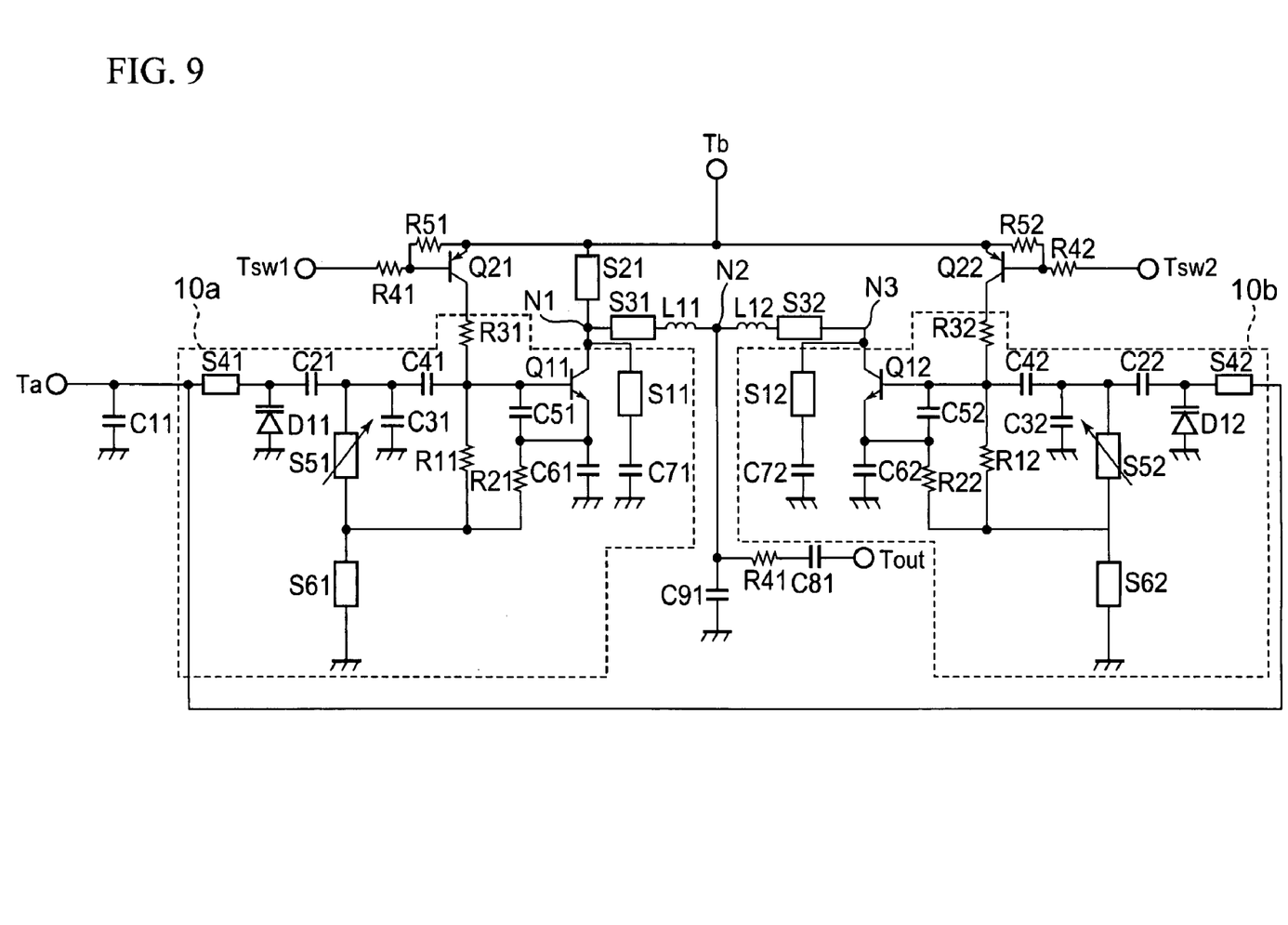
FIG. 9 is a circuit diagram of the oscillator employed in a modification 2 of the second exemplary embodiment of the present invention.

FIG. 9 is a circuit diagram of the oscillator employed in a modification 2 of the second exemplary embodiment of the present invention. There is provided a resistor R41 for noise reduction between the second intermediate node N2 and the capacitor C81, unlike the configuration shown in FIG. 8 used in the modification 1 of the second exemplary embodiment. In the oscillator employed in the modification 2 of the second exemplary embodiment, other configurations are same as those of the modification 1 of the second exemplary embodiment.

Third Exemplary Embodiment

Figure 10:
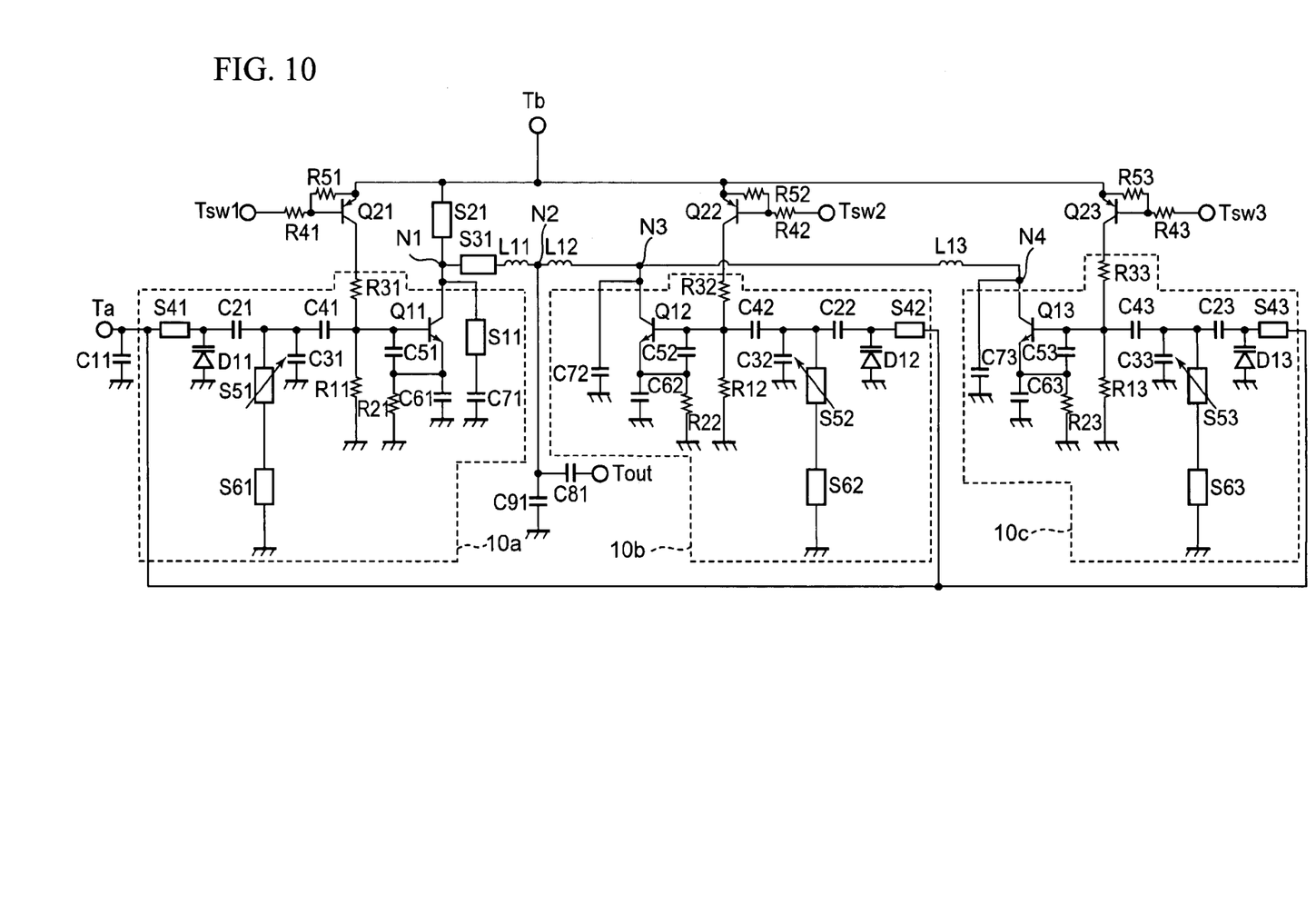
FIG. 10 is a circuit diagram of the oscillator employed in a third exemplary embodiment of the present invention.

FIG. 10 is a circuit diagram of the oscillator employed in a third exemplary embodiment of the present invention. The oscillator employed in the third exemplary embodiment includes: the first oscillating portion 10a and the second oscillating portion 10b employed in the second exemplary embodiment; and a third oscillating portion 10c that outputs a third oscillation signal having a third oscillation frequency. There is provided a third intermediate node N3 between the second intermediate node N2 and the second oscillating portion 10b. The third oscillating portion 10c is coupled through a third inductance element, which is an inductor L13, to the third intermediate node N3, and outputs through the third intermediate node N3 to the output terminal Tout. That is to say, in the third oscillating portion 10c, the third oscillation signal is output through the third inductance element, which is the inductor L13, and the second inductance element, which is the inductor L12, to the output terminal Tout, and a voltage is supplied by way of the first (the line S31 and the inductor L11), second, and third inductance elements.

As stated, in the third exemplary embodiment, the second line S21, the first inductance element, and the second inductance element serve as an inductance for choke common to the second oscillating portion 10b and the third oscillating portion 10c. This makes it possible to reduce the inductance part for choke in the third oscillating portion 10c.

When the third oscillation frequency of the third oscillating portion 10c is lower than the second oscillation frequency of the second oscillating portion 10b, it is desirable that the inductance for choke connected to the third oscillating portion 10c be greater than that connected to the second oscillating portion 10b. In the third exemplary embodiment, not only the second oscillating portion 10b but also the third inductance element are added to the third oscillating portion 10c, thereby allowing the inductance for choke of the third oscillating portion 10c to be greater than that of the second oscillating portion 10b.

Furthermore, the second inductance element also serves as an inductance element for high-frequency cutoff between the second oscillating portion 10b and the output terminal Tout. The second inductance element and the third inductance element serve as an inductance element for high-frequency cutoff between third oscillating portion 10c and the output terminal Tout. This makes it possible to reduce the number of parts and costs thereof.

In the second and third exemplary embodiments, the first, second, and third inductance elements may be made up of a line pattern or inductor. To accomplish the fine adjustment in the design process, it is preferable that at least a line pattern provided in an insulating layer of the mounting portion should be included, as in the first exemplary embodiment of the present invention.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

What is claimed is:

1. An oscillator comprising:
    a first oscillating portion that outputs a first oscillation signal having a first oscillation frequency through a first intermediate node to an output terminal;
    a mounting portion that includes an insulating layer and that mounts the first oscillating portion;
    a first line provided in the insulating layer and coupled between the first intermediate node and ground;
    a second line provided in the insulating layer and coupled between the first intermediate node and a power supply terminal;
    a third line provided in the insulating layer and coupled between the first intermediate node and the output terminal; and
    a first capacitor connected between the first line and the ground,
    wherein the first line and the first capacitor have an impedance for preventing a leakage of the first oscillation signal to the ground.

2. The oscillator as claimed in claim 1, wherein:
    the insulating layer is made of stacked multiple insulating layers; and
    the first line, the second line, and the third line are respectively provided in different insulating layers.

3. The oscillator as claimed in claim 1, wherein the first line, the second line, and the third line are each directly connected to the first intermediate node.

4. The oscillator as claimed in claim 1, further comprising a second capacitor connected between the third line and the output terminal.

5. The oscillator as claimed in claim 1, further comprising an inductor connected between the third line and the output terminal.

6. The oscillator as claimed in claim 1, wherein: the first oscillating portion includes:
    a resonance circuit that generates a resonance signal having a frequency controlled by a control voltage; and
    an oscillation circuit that generates the first oscillation signal having the frequency of the resonance signal.

7. The oscillator as claimed in claim 1, wherein the first oscillating portion does not include a buffer circuit therein.

8. An oscillator comprising:
    a first oscillating portion that outputs a first oscillation signal having a first oscillation frequency through a first intermediate node to an output terminal;
    a mounting portion that includes an insulating layer and that mounts the first oscillating portion;
    a first line provided in the insulating layer and coupled between the first intermediate node and ground;
    a second line provided in the insulating layer and coupled between the first intermediate node and a power supply terminal;
    a third line provided in the insulating layer and coupled between the first intermediate node and the output terminal; and
    a second oscillating portion that is connected through a second inductance element to a second intermediate node provided between the first intermediate node and the output terminal, and that outputs a second oscillation signal having a second oscillation frequency through the second intermediate node to the output terminal.

9. The oscillator as claimed in claim 8, wherein the second oscillation frequency is lower than the first oscillation frequency.

10. The oscillator as claimed in claim 8, further comprising a third oscillating portion that is connected through a third inductance element to a third intermediate node provided between the second intermediate node and the second oscillating portion, and that outputs a third oscillation signal having a third oscillation frequency through the third intermediate node to the output terminal.

11. The oscillator as claimed in claim 10, wherein the third oscillation frequency is lower than the second oscillation frequency.

* * * * *